(12) United States Patent
Kitani et al.

(10) Patent No.: US 9,578,793 B2
(45) Date of Patent: Feb. 21, 2017

(54) COMPONENT SUPPLYING APPARATUS AND COMPONENT SUPPLYING METHOD

(71) Applicant: Panasonic Intellectual Property Management Co., Ltd., Osaka (JP)

(72) Inventors: Minoru Kitani, Osaka (JP); Motohiro Higuchi, Nara (JP); Shigeru Matsukawa, Osaka (JP); Kazuo Kido, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/417,401

(22) PCT Filed: Feb. 15, 2013

(86) PCT No.: PCT/JP2013/000853
§ 371 (c)(1),
(2) Date: Jan. 26, 2015

(87) PCT Pub. No.: WO2014/016980
PCT Pub. Date: Jan. 30, 2014

(65) Prior Publication Data
US 2015/0195963 A1    Jul. 9, 2015

(30) Foreign Application Priority Data
Jul. 27, 2012    (JP) .................................. 2012-167331

(51) Int. Cl.
*B32B 38/10* (2006.01)
*H05K 13/02* (2006.01)
(Continued)

(52) U.S. Cl.
CPC ............. *H05K 13/02* (2013.01); *B32B 43/006* (2013.01); *H05K 13/0417* (2013.01);
(Continued)

(58) Field of Classification Search
CPC ....... B32B 38/10; B32B 43/006; H05K 13/02; H05K 13/0417; B65H 37/002; Y10T 156/1184; Y10T 156/1961; Y10T 156/1967
(Continued)

(56) References Cited

U.S. PATENT DOCUMENTS

| 4,820,369 A | 4/1989 | Kubo |
| 6,619,526 B1 * | 9/2003 | Souder, Jr. ............. B65H 20/22 156/751 |

(Continued)

FOREIGN PATENT DOCUMENTS

| CN | 101554101 | 10/2009 |
| CN | 102209462 | 10/2011 |

(Continued)

OTHER PUBLICATIONS

International Preliminary Report on Patentability issued Jan. 29, 2015 in International (PCT) Application No. PCT/JP2013/000853.
(Continued)

*Primary Examiner* — Mark A Osele
*Assistant Examiner* — Nickolas Harm
(74) *Attorney, Agent, or Firm* — Wenderoth, Lind & Ponack, L.L.P.

(57) ABSTRACT

A component supplying apparatus comprises an inclined straight path P2 which is for the carrier tape and which extends obliquely upward, a horizontal straight path P3 which is for the carrier tape and which extends in the horizontal direction from a front end of the inclined path P2 and runs through the component supply position Q, a first sprocket wheel engaging with the feed holes of the carrier tape within the inclined path P2, a guide member locating the carrier tape in the width direction within the horizontal path, a top tape removing device disposed above the inclined path P2 between the first sprocket wheel and the horizontal path P3 and partially removing the top tape from the base tape so as to expose the components, and a sprocket wheel drive device rotating the first sprocket wheel.

8 Claims, 11 Drawing Sheets

(51) Int. Cl.
*H05K 13/04* (2006.01)
*B32B 43/00* (2006.01)
*B65H 37/00* (2006.01)

(52) U.S. Cl.
CPC ........... *B32B 38/10* (2013.01); *B32B 2457/00* (2013.01); *B65H 37/002* (2013.01); *Y10T 156/11* (2015.01); *Y10T 156/1184* (2015.01); *Y10T 156/1961* (2015.01); *Y10T 156/1967* (2015.01)

(58) Field of Classification Search
USPC ........................................ 156/717, 761, 762
See application file for complete search history.

(56) References Cited

U.S. PATENT DOCUMENTS

| | | | |
|---|---|---|---|
| 2003/0219330 A1 | 11/2003 | Lyndaker et al. | |
| 2008/0217459 A1* | 9/2008 | Wada | H05K 13/0417 242/389 |
| 2009/0071996 A1 | 3/2009 | Horie | |
| 2009/0249615 A1* | 10/2009 | Yonemitsu | H05K 13/0417 29/740 |
| 2010/0239401 A1* | 9/2010 | Kim | B65H 37/002 414/412 |
| 2011/0243695 A1 | 10/2011 | Hwang et al. | |

FOREIGN PATENT DOCUMENTS

| | | |
|---|---|---|
| EP | 2 079 294 | 7/2009 |
| JP | 59-166499 | 11/1984 |
| JP | 63-112366 | 5/1988 |
| JP | 2-28999 | 1/1990 |
| JP | 2-77200 | 3/1990 |
| JP | 2005-539370 | 12/2005 |
| JP | 2007-27246 | 2/2007 |
| JP | 2007-67156 | 3/2007 |
| JP | 2011-211169 | 10/2011 |
| WO | 03/101172 | 12/2003 |
| WO | 2007/007912 | 1/2007 |

OTHER PUBLICATIONS

International Search Report issued Mar. 12, 2013 in International (PCT) Application No. PCT/JP2013/000853.

* cited by examiner

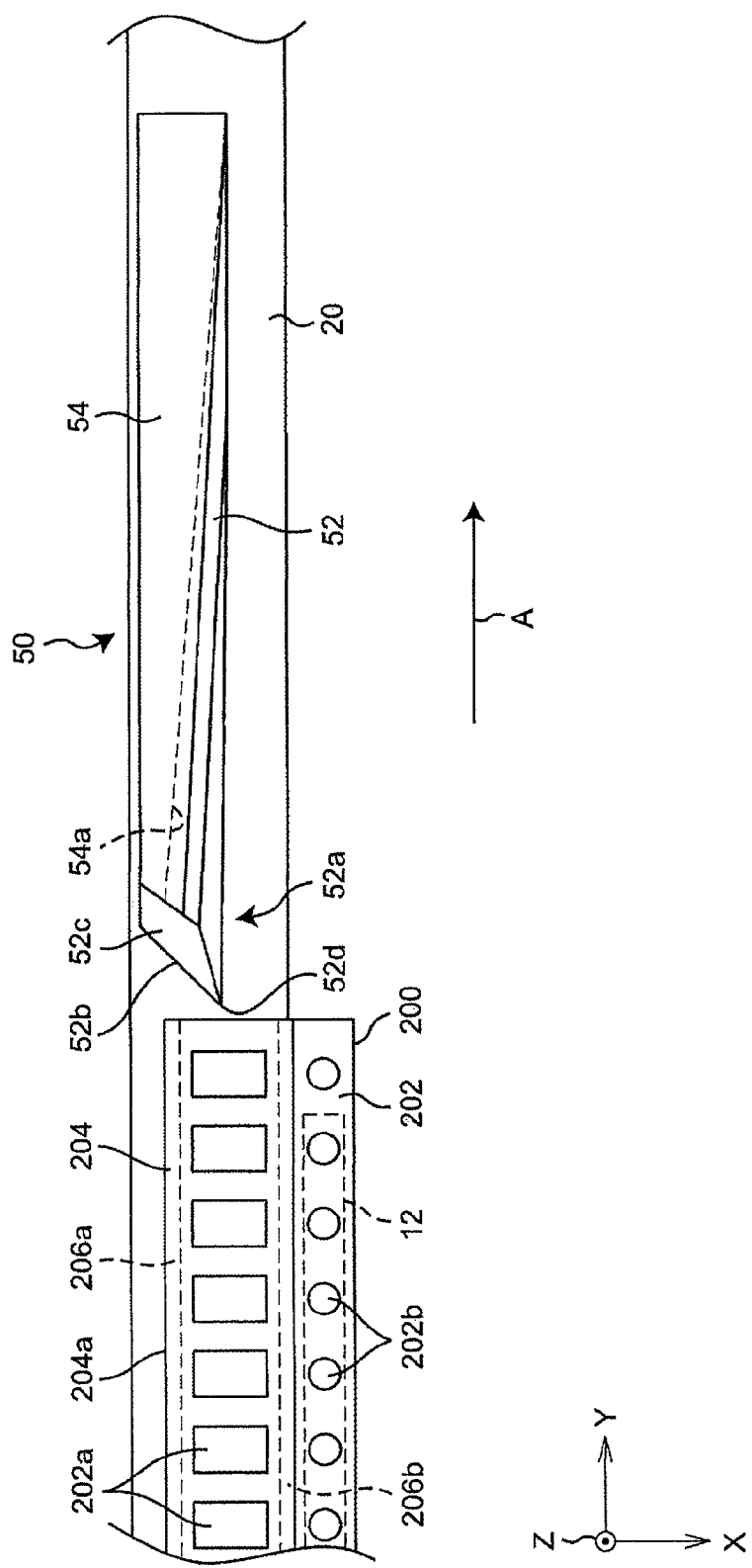

COMPONENT SUPPLYING APPARATUS AND COMPONENT SUPPLYING METHOD

TECHNICAL FIELD

The invention relates to a component supplying apparatus and a component supplying method for supplying components onto nozzles of a transfer head of a component mounting apparatus.

BACKGROUND ART

Conventionally, a carrier tape has been used for supplying components (for example, electronic components) onto nozzles of a transfer head of a component mounting apparatus. The carrier tape has a base tape in which a plurality of depressed or embossed recesses accommodating components are arranged in a tape length direction and a top tape which is pasted on the base tape so as to cover the plurality of recesses accommodating the components. The top tape is removed from the base tape such that the components in the recesses of the carrier tape can be sucked by the nozzles of the transfer head of the component mounting apparatus.

For example, the component supplying apparatus described in Patent document 1 is configured to feed a carrier tape in a horizontal direction toward a component supply position. The component supply position is a position at which the components in the recesses of the carrier tape are sucked by nozzles of a transfer head of a component mounting apparatus. The component supplying apparatus also has a top tape removing device positioned on upstream side of the component supply position in a tape feeding direction and removing the top tape from the carrier tape. The top tape removing device is above the carrier tape fed in the horizontal direction toward the component supply position and configured to peel the top tape in a direction opposite to the carrier tape feeding direction.

PRIOR ART DOCUMENT(S)

Patent Document 1: Japanese Laid-Open Utility model Publication No. S59-166499

SUMMARY OF THE INVENTION

Problems to be Solved by the Invention

However, in the component supplying apparatus described in the Patent document 1, the position of the top tape removing device for removing the top tape from the carrier tape is higher than the component supply position. It therefore is possible that the transfer head or the nozzle thereof moving in the horizontal direction is interfered by the top tape removed from the carrier tape before the nozzle of the transfer head picks up the component at the component supply position or after the nozzle has picked up the component.

Accordingly, it is an object of the invention, to remove a tope tape from a carrier tape fed so as to expose components in recesses while avoiding an interference in level between the top tape and a transfer head of a component mounting apparatus.

Means to Solve the Problems

In order to achieve the above object, the present invention has the following constitutions.

According to a first aspect of the invention, there is provided a component supplying apparatus for feeding a carrier tape toward a component supply position, the carrier tape has a base tape having a plurality of recesses for accommodating components and a plurality of feed holes with the recesses and feed holes parallel arranged thereon in a tape longitudinal direction and a top tape pasted on the base tape so as to cover the recesses, the component supply position is a position at which the components are sucked by a nozzle of a transfer head of a component mounting apparatus moving in at least horizontal direction, the component supplying apparatus comprising:

an inclined path which is for the carrier tape and which extends in straight and obliquely upward;

a horizontal path which is for the carrier tape and which extends in straight and in the horizontal direction from a front end of the inclined path and runs through the component supply position;

a first sprocket wheel engaging with the feed holes of the carrier tape within the inclined path;

a guide member locating the carrier tape in the width direction within the horizontal path;

a top tape removing device disposed above the inclined path between the first sprocket wheel and the horizontal path and partially removing the top tape from the base tape so as to expose the components; and a sprocket wheel drive device rotating the first sprocket wheel.

According to a second aspect of the invention, there is provided the component supplying apparatus according to the first aspect, wherein the guide member is a second sprocket wheel engaging with the feed holes of the carrier tape within the horizontal path, and the sprocket wheel drive device synchronously rotates the first and second sprocket wheels.

According to a third aspect of the invention, there is provided the component supplying apparatus according to the first or second aspect, wherein the top tape removing device is configured to be disposed below a lower limit level of a nozzle tip of the transfer head when moving or below a level of the component supply position.

According to a fourth aspect of the invention, there is provided the component supplying apparatus according to any one of the first to third aspects, wherein the top tape removing device is disposed in a space between the inclined path and a top cover which is positioned within an operation range in the horizontal direction of the transfer head or the nozzle of the transfer head and which is a top portion of a housing of the component supplying apparatus.

According to a fifth aspect of the invention, there is provided the component supplying apparatus according to any one of the first to fourth aspects, wherein the component supply position is positioned on the horizontal path such that the nozzle of the transfer head sucks the component accommodated in the recess close to the feed hole engaged with a tooth of the second sprocket wheel within horizontal path.

According to a sixth aspect of the invention, there is provided a component supplying method for feeding a carrier tape toward a component supply position, the carrier tape has a base tape having a plurality of recesses for accommodating components and a plurality of feed holes with the recesses and feed holes parallel arranged thereon in a tape longitudinal direction and a top tape pasted on the base tape so as to cover the recesses, the component supply position is a position at which the components are sucked by a nozzle of a transfer head of a component mounting apparatus moving in at least horizontal direction, the component supplying method comprising:

feeding the carrier tape by rotation of a first sprocket wheel engaging with the feed holes of the carrier tape within a inclined path which is for the carrier tape and which extends in straight and in obliquely upward while locating the carrier tape in the width direction by using of a guide member within a horizontal path which is for the carrier tape and which extends in straight and in the horizontal direction from the inclined path and runs through the component supply position, and partially removing the top tape from the base tape so as to expose the components by using of a top tape removing device disposed above a portion of the inclined path between the first sprocket wheel and the horizontal path.

Effects of the Invention

According to the invention, the top tape can be removed from the carrier tape fed so as to expose the components in the recesses while avoiding the interference in level between the top tape and a transfer head of a component mounting apparatus.

BRIEF DESCRIPTION OF THE DRAWINGS

The above aspects and features of the present invention will become more apparent from the following description of preferred embodiments thereof with reference to the accompanying drawings, and wherein:

FIG. 4A is a top view of the top tape removing device right before removing the top tape.

EMBODIMENTS FOR CARRYING OUT THE INVENTION

Hereinbelow, an embodiment of the invention will be described with reference to the drawings.

Figure 1:
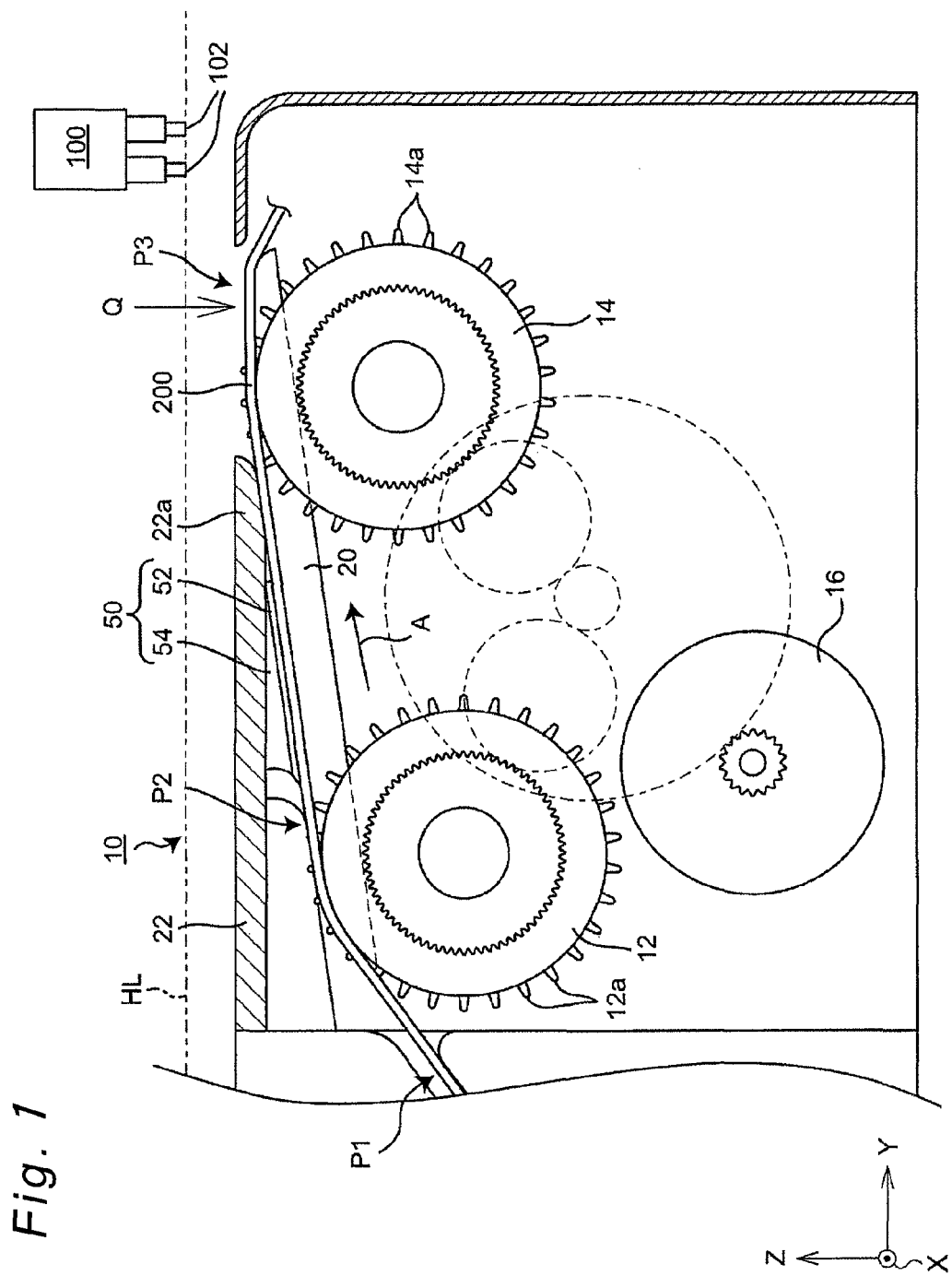
FIG. 1 shows a schematic configuration of a part of a component supplying apparatus according to an embodiment of the invention.

FIG. 1 schematically shows a configuration of a part of a component supplying apparatus in accordance with the embodiment of the invention.

The component supplying apparatus 10 shown in FIG. 1 is configured to supply components (for example, electronic components) onto nozzles 102 equipped on a transfer head 100 of a component mounting apparatus.

Specifically, the component supplying apparatus 10 shown in FIG. 1 feeds a carrier tape 200 holding a plurality of components supplied onto the nozzles 102 equipped on the transfer head 100 of the component mounting apparatus such that the components held by the carrier tape 200 are serially fed toward a component supply position Q. The component supply position Q is a position at which the nozzles 102 of the transfer head 100 of the component mounting apparatus moving in at least a horizontal direction suck the components.

Figure 2:
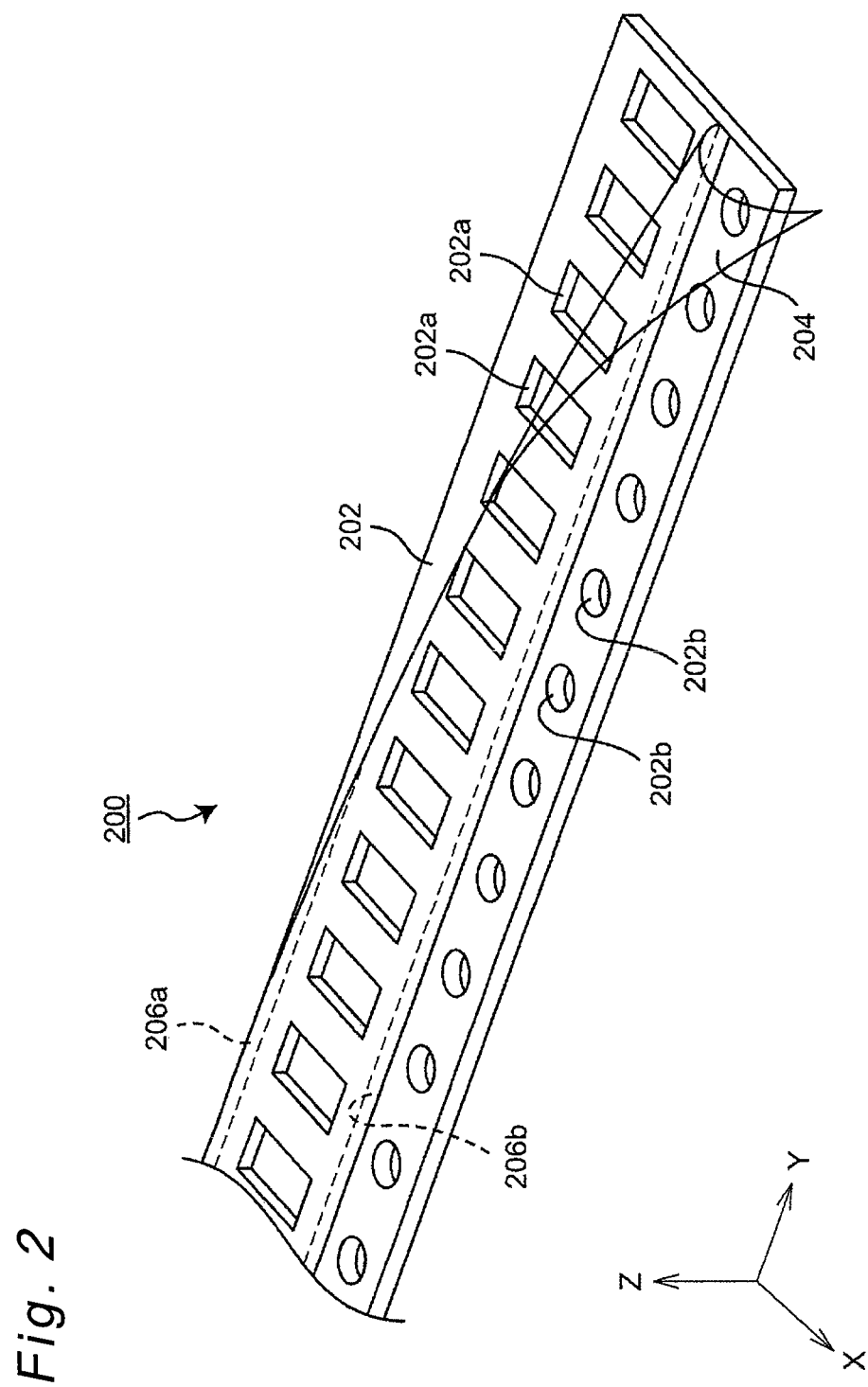
FIG. 2 is a perspective view of a carrier tape.

FIG. 2 is a perspective view of the carrier tape 200 fed by the component supplying apparatus 10. As shown in FIG. 2, the carrier tape 200 has a base tape 202 having a plurality of depressed recesses 202a accommodating the components (not shown) sucked by the nozzles 102 of the transfer head 100 of the component mounting apparatus and a top tape 204 pasted on the base tape 202 so as to cover the recesses 202a. The base tape 202 also has a plurality of feed holes 202b penetrating in a tape thickness direction.

The recesses 202a, as shown in FIG. 2, are formed on one side of the base tape 202 in a tape width direction (X-direction) so as to be arranged, for example, in a tape longitudinal direction of the carrier tape 200. The feed holes 202b are formed on the other side of the base tape 202 so as to be arranged in the tape longitudinal direction of the carrier tape 200.

The top tape 204 is pasted on the base tape 202 through adhesives 206a, 206b and like without covering the feed holes 202b. Specifically, a center part in the tape width direction (X-direction) of the top tape 204 covers the recesses 202a while both ends in the tape wide direction of the top tape 204 are pasted on the base tape 202 through the adhesives 206a and 206b. Although the feed holes 202b are formed on one side in the tape width direction of the carrier tape 200 in the embodiment, feed holes may be formed on both sides in the tape width direction across the component recesses, for example, in a carrier tape accommodating big-size components.

In order to feed the carrier tape 200 shown in FIG. 2 toward the component supply position Q, the component supplying apparatus 10, as shown in FIG. 1, has a plurality of tape paths P1-P3, and a first and second sprocket wheels 12 and 14 as sprocket wheels for feeding the carrier tapes 200 along the tape paths P1-P3. The component supplying apparatus 10 also has a top tape removing device 50 for removing the top tape 204 from the carrier tape 200 (base tape 202) fed by the first and second sprocket wheels 12 and 14.

The first and second sprocket wheels 12 and 14 have teeth 12a and 14a inserted into the feed holes 202b of the carrier tape 200. The first and second sprocket wheels 12 and 14 rotate with teeth 12a and 14a inserted into (engaging with) the feed holes 202b of the carrier tape 200, and thereby feeds the carrier tape 200 toward the component supply position Q.

The component supplying apparatus 10 has a motor 16 as a sprocket wheel drive device for rotating the first and second sprocket wheels 12 and 14. As will become apparent below, the first and second sprocket wheels 12 and 14 are synchronized in rotation by the driving motor 16 through a plurality of gears (presented by dashed-dotted lines).

The component supplying apparatus 10 has a tape path (not shown) other than the tape paths P1-P3 and a sprocket wheel (not shown) other than the first and second sprocket wheels. The component supplying apparatus 10 has, for example, a sprocket wheel for feeding the carrier tape 200 toward the first sprocket wheel 12 from a reel (not shown) on which the carrier tape 200 is wound.

The carrier tapes 200 fed by the first and second sprocket wheels 12 and 14 (and a sprocket wheel not shown) move by being serially fed along the tape paths P1-P3 (and a tape path not shown) toward the component supply position Q.

The tape path P1 is an inclined path extending obliquely upward (in Y-direction and Z-direction) from an upstream of the first sprocket wheel 12 in a feeding direction (direction of arrow A) of the carrier tape 200 toward the first sprocket wheel 12.

The tape path P2 is an inclined straight path extending obliquely upward (in Y-direction and Z-direction) from a downstream end (front end) of the tape path P1 in the feeding direction of the carrier tape 200 toward a level of the component supply position Q.

The tape path P3 is a horizontal straight path extending (in Y-direction) from a downstream end (front end) of the tape path P2 in the feeding direction of the carrier tape 200 and running through the component supply position Q.

In the description, the downstream end of the tape path in the feeding direction of the carrier tape 200 is termed the front end and the upstream end is termed a rear end.

The first sprocket wheel 12 engages with the feed holes 202b of the carrier tape 200 within the front end of the tape path P1 and the rear end of the tape path P2.

The second sprocket wheel 14 engages with the feed holes 202b of the carrier tape 200 within the front end of the tape path P2 and the rear end of the tape path P3. The component supply position Q is positioned on downstream side of the second sprocket wheel 14 in the feeding direction of the carrier tape 200.

The tape paths P1 and P2 extending obliquely upward from the upstream to the downstream of the feeding direction of the carrier tape 200 may extend in the same direction. The tape path P1 may extend in the horizontal direction from the upstream to the downstream of the feeding direction of the carrier tape 200.

The component supply position Q preferably is positioned on the tape path P3 which is a horizontal path extending in the horizontal direction such that the nozzles 102 of the transfer head 100 can suck the components accommodated in the recesses 202a close to (or adjacent to) the feed holes 202b engaging with the teeth 14a of the second sprocket wheel 14. Since the teeth 14a of the second sprocket wheel 14 engage with the feed holes 14a of the carrier tape 200 close to the component supply position Q, the components in the recesses 202a of the carrier tape 200 can be exactly-aligned at the component supply position Q.

The component supplying apparatus 10 is provided with a guide member 20 for slidably guiding the carrier tape 200 such that the tape paths P2 and P3 can straighten, that is, the carrier tape 200 goes straight on the tape paths P2 and P3 respectively.

Specifically, the guide member 20 is configured to support at least portion of a back surface (a surface opposite to the surface on which the top tape 204 is pasted) of the base tape 202, which is on the opposite side of the recesses 202a, so as to avoid an interference to the first and second sprocket wheels 12 and 14 of which the teeth 12a and 14a are inserted into the feed holes 202b.

The top tape removing device 50 is configured to expose the components (not shown) accommodated in the recesses 202a by partially removing the top tape 204 from the base tape 202 as shown in FIG. 2.

Specifically, in the embodiment, the top tape removing device 50 is configured to remove a portion of the top tape 204 other than a feed hole 202b-side portion in the tape width direction (X-direction) of the top tape 204 of which both ends in the tape width direction are pasted on the base tape 202, without removing the feed hole 202b-side portion.

As shown in FIG. 1, the top tape removing device 50 is disposed above the tape path P2 which is an inclined path between the first sprocket wheel 12 and the tape path P3 that is an horizontal path. Specifically, the top tape removing device 50 is attached to a lower surface of an openable or detachable top cover 22. the top cover 22 is positioned within an operating range in the horizontal direction of the transfer head 100 or the nozzles 102 of the transfer head 100 of the component mounting apparatus and is a top portion of a housing of the component supplying apparatus 10. That is, the top tape removing device 50 is positioned in a space between the top cover 22 and the tape path P2 as an inclined path.

Figure 3A:
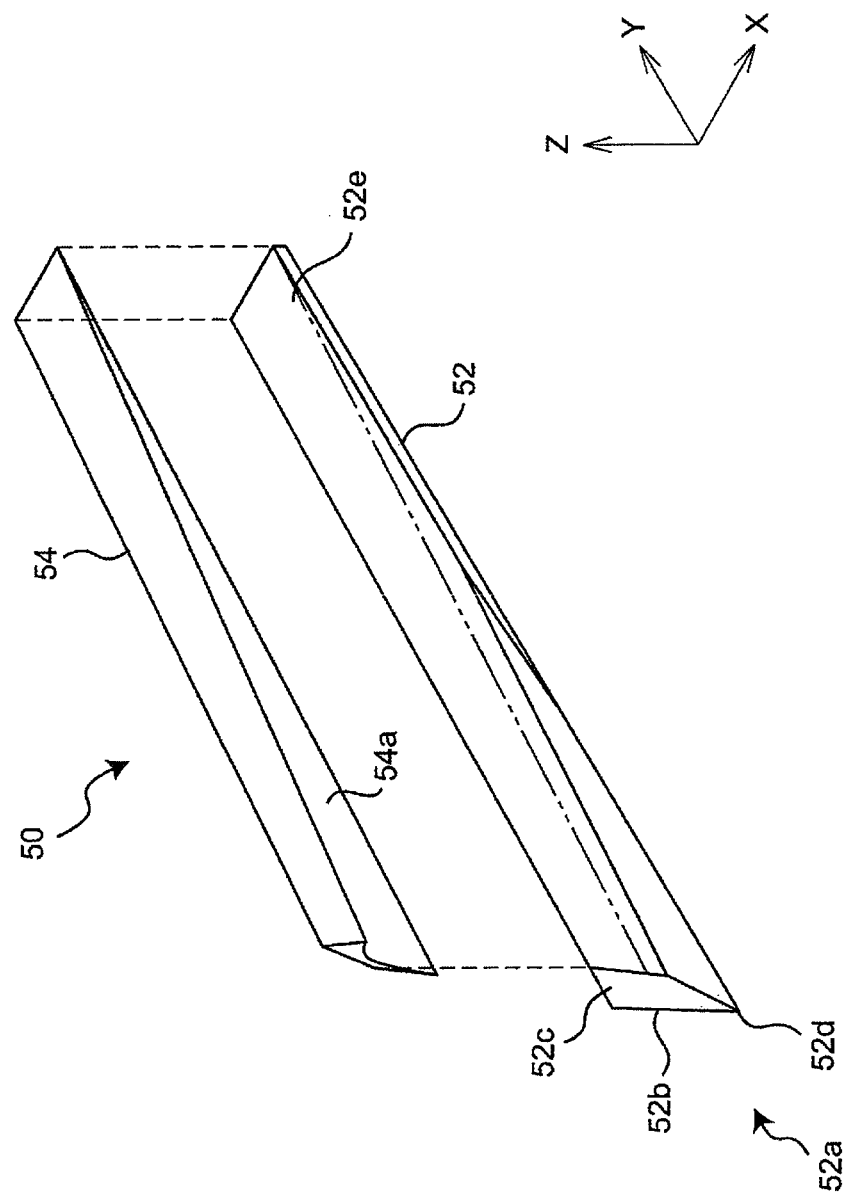
FIG. 3A is an exploded view of a top tape removing device.
Figure 3B:
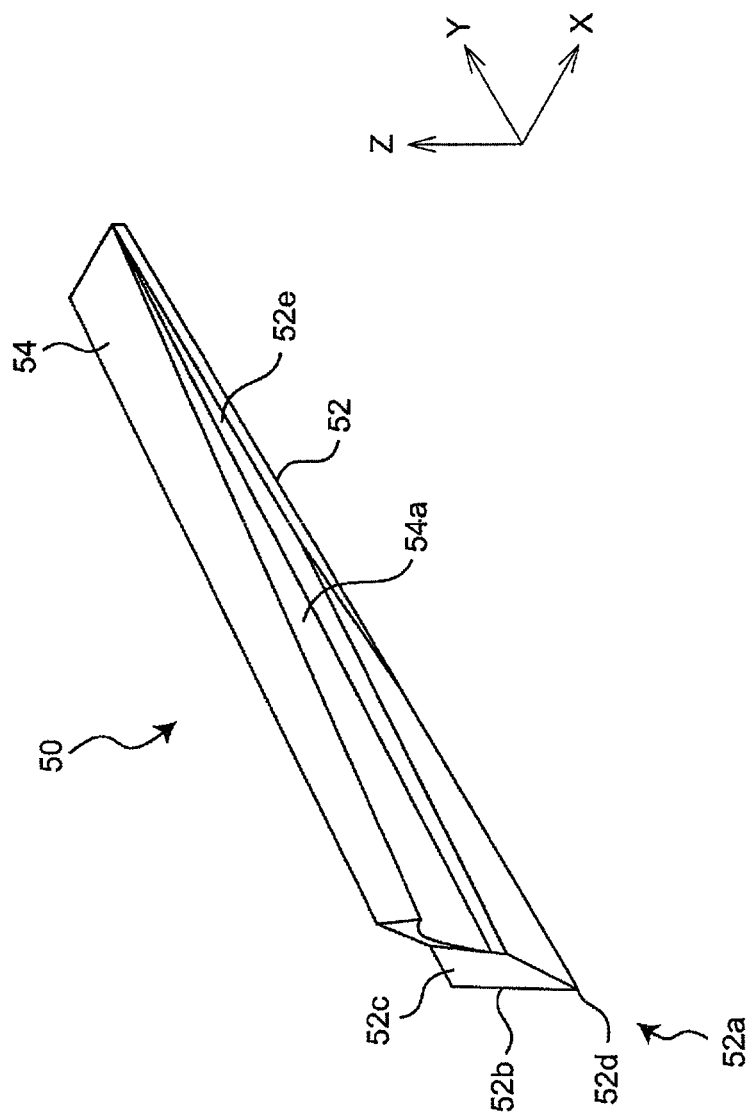
FIG. 3B is a perspective view of the top tape removing device.

The configuration of the top tape removing device 50, which partially removes the top tape 204 from the carrier tape 200 (base tape 202) as shown in FIG. 2, is explained below. FIG. 3A is an exploded view of a top tape removing device 50. FIG. 3B is a perspective view of the top tape removing device 50.

As shown in FIGS. 3A and 3B, the top tape removing device 50 has a removing member 52 for partially removing the top tape 204 from the base tape 202 and a fold-back member 54 for folding back top tape 204 partially removed by the removing member 52 toward the feed hole 202b-side as shown in FIG. 2.

The removing member 52 is made by forming a blade part 52a for partially removing the top tape 204 from the base tape 202 on a strip of a metal plate.

The blade part 52a has a blade edge 52b removing the top tape 204 from the base tape 202, a rake face 52c for guiding the removed portion of the top tape 202 and thus scooping the removed portion so as to separate from the base tape 202, and a point 52d for entering between the top tape 204 and the base tape 202.

The fold-back member 54 is attached to an upper surface 52e which is a top portion of the removing member 52. The fold-back member 54 has a concave and conically-curved surface 54a for guiding the portion of the top tape 204 removed by the removing member 52 so as to fold back the removed portion toward the feed hole 202b-side. The concave and conically-curved surface 54a extends from the upper surface 52e, curves in concave-like fashion, and overhangs the upper surface 52e.

FIG. 4A is a top view of the top tape removing device 50 right before removing the top tape 204 from the carrier tape 200 (base tape 202).

The top tape removing device 50 is attached to the back surface of the top cover 22 of the component supplying apparatus 10 such that the point 52d of the removing member 52 can enter into an interspace between the base tape 202 and the top tape 204 (that is, un-bonded portion between the adhesives 206a and 206b) as shown in FIG. 4A. The concave and conically-curved surface 54a of the fold-back member 54 faces on the feed hole 202b-side of the carrier tape 200.

The front end of the carrier tape 200 is fed toward the component supply position Q (in the direction of arrow A) by the first and second sprocket wheels 12 and 14, and thus the point 52d of the removing member 52 of the top tape removing device 50 enters between the base tape 202 and the top tape 204.

The carrier tape 200 is further fed toward the component supply position Q (in the direction of arrow A) with the point 52d of the removing member 52 of the top tape removing device 50 being between the base tape 202 and the top tape 204. Then, the blade edge 52b of the removing member 52 starts to remove a portion of the top tape 204 from the base tape 202.

Specifically, the blade edge 52b of the removing member 52 starts to remove the portion of the top tape 204 which is opposite to the portion on the feed hole 202b-side in the tape width direction (X-direction) and which is pasted on the base tape 202 by the adhesive 206a. The portion of the top tape 204 removed by the blade edge 52b is guided by the rake face 52c and moves toward the curved surface 54a of the fold-back member 54, while the carrier tape 200 is fed.

Figure 4B:
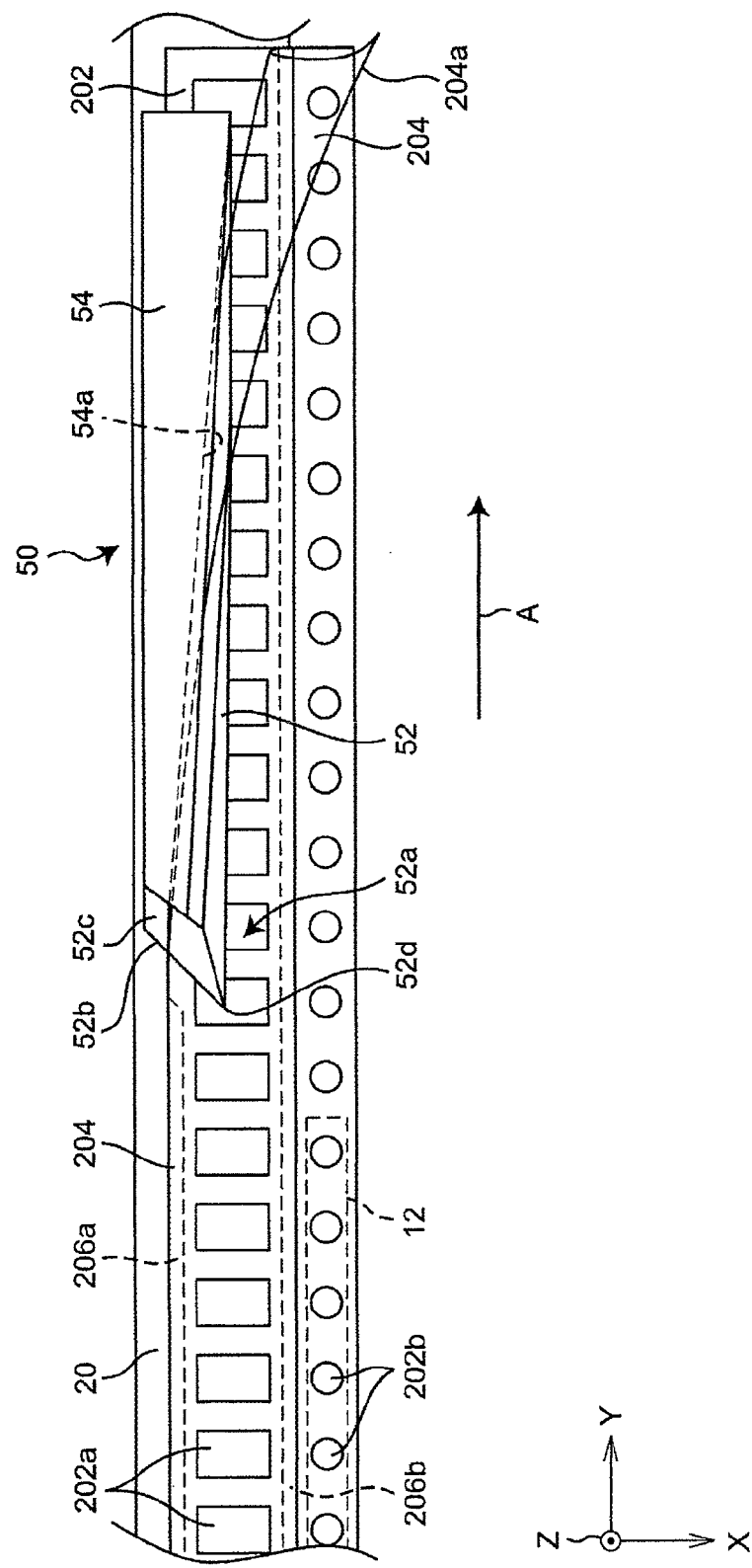
FIG. 4B is a top view of the top tape removing device during removing the top tape.

While the carrier tape 200 is fed toward the component supply position Q (in the direction of arrow A), the portion of the top tape 204 removed from the base tape 202 is folded back toward the feed hole 202b-side by the concave and conically-curved surface 54a of the fold-back member 54 as shown in FIG. 4B.

Specifically, the portion 204a of the top tape 204, which is opposite to the portion on the feed hole 202b-side in the tape width direction (X-direction) of the top tape 204, is guided by the concave and conically-curved surface 54a, and thereby fold back the portion 204a of the top tape 204 removed from the base tape 202 toward the feed hole 202b-side.

By use of the top tape removing device 50, the carrier tape 200 can be fed to the component supply position Q with the top tape 204 partially removed from the base tape 202 so as to expose the components accommodated in the recesses 202a of the carrier tape 200. Consequently, the nozzles 102 of the transfer head 100 of the component mounting apparatus can suck and pick up the components accommodated in recesses 202a of the base tape 202 at the component supply position Q.

According to the component supplying apparatus 10 of the embodiment, the top tape removing device 50 is disposed within a sloped space between the top cover 22 and the tape path P2 which is a inclined path. Consequently, the top tape 204 can be removed from the carrier tape 200 fed so as to expose the components in the recesses 202a while avoiding an interference in level between the top tape 204 and the transfer head 100 or the nozzles 102 thereof of the component mounting apparatus which moving in the horizontal direction. In particular, if the transfer head 100 has a plurality of nozzles 102, a nozzle picking up the component at the component supply position Q or the other nozzles can move in the horizontal direction without interference in level from the component supplying apparatus 10.

Specifically, as shown in FIG. 1, the top tape removing device 50 is disposed in the space between the top cover 22 and the tape path P2 which is an inclined path. Therefore, a tip of the nozzle 102 of the transfer head 100 of the component mounting apparatus sucking and holding the component can move in the horizontal direction at a level HL, which is as low as possible, so as to reduce travel time for traveling between the component supply position Q (position for picking up the component from the carrier tape 200) and a component mount position (for example, a position on a substrate). More specifically, the tip of the nozzle 102 of the transfer head 100 can move in the horizontal direction at the level (lower limit level) HL which is low height, such that an elevating strokes (in Z-direction) of the nozzles 102 with respect to the transfer head 100 is as small as possible during mounting the components, that is, so as to reduce a difference between the level at which the nozzles 102 pick up the components on the component supply position Q and the level at which the nozzles 102 move in the horizontal direction after and before picking up the components.

The lower limit level HL at which the tip of the nozzles 102 move horizontally is based on the levels of the component supply position Q and the component mount position, and is set so as to avoid the interference in level (encounter) between the transfer head 100 or the nozzles 102 thereof in moving horizontally and the component mounting apparatus or the component supplying apparatus.

The horizontal movement of the nozzle referred in the description of the this application means that the nozzle moves in at least horizontal direction and does not mean that the nozzle moves in only horizontal direction. Therefore, the horizontal movement of the nozzle referred in the description includes a nozzle movement in up-down direction (Z-direction) while moving horizontally, that is, an arch motion of the nozzle.

Within a region in which the nozzles 102 move horizontally after and before picking the components at the component supply position Q during mounting operation for picking up the components on the component supply position Q and mounting the components on the substrate, it is necessary that the component supplying apparatus 10 is configured to reduce portions thereof getting across the level of the component supply position Q, in particular, have no portions getting across the lower limit level HL of the tips of the nozzles 102.

In the embodiment, the top tape removing device 50, which is naturally disposed above the carrier tape 200 so as to partially remove the top tape 204, is configured to have no upward protrusions getting across the level of the component supply position Q.

Specifically, the component supplying apparatus 10 has the inclined tape path P2 extending obliquely upward toward the component supply position Q as a portion of the path of the carrier tape 200. Within the sloped space above the carrier tape 200 on the inclined tape path P2, the top tape removing device 50 is disposed. Therefore, portions getting across the level of the component supply position in the top tape removing device are reduced, as compared with the case that the top tape removing device is disposed above the carrier tape on a tape path which extends in the horizontal direction toward the component supply position and thus which is different from the tape path P2. Thereby further avoid the interference between the component supplying apparatus 10 and the tip of the nozzles 102 of the transfer head 100 of the component mounting apparatus and further lower the lower limit level HL of the nozzles 102 moving horizontally.

In the embodiment, the entire top tape removing device 50 is disposed below the level of the component supply position Q as shown in FIG. 1. However, a part of the top tape removing device 50 may get across the level of the component supply position Q on condition that the part does not get across the lower limit level HL at which the tips of the nozzles 102 move horizontally. Thereby improve design freedom of the component supplying apparatus 10.

In the embodiment, the top tape 204 is removed from the carrier tape 200 on the straight tape path. Therefore, the top tape removing device 50 can smoothly and speedily remove the top tape 204 from the base tape 202.

Specifically, as shown in FIG. 1, the top tape 204 is partially removed from a portion of the carrier tape 200 on the straight tape path P2 extending in an oblique direction, that is, from a portion of the carrier tape 200 linearly and slidably guided by the guide member 20.

When the carrier tapes 200 are serially fed along the straight tape path P2 by guiding of the guide member 20, a friction between the carrier tape 200 and the guide member 20 is small, as compared with the case that the carrier tape is fed along a curved tape path. Therefore, the top tape removing device 50 can smoothly remove the top tape 204 from the portion of the carrier tape 200 guided by the guide member 20 and thus smoothly fed at a steady rate. Moreover, the carrier tape 200 can be fed at high speed by reason of low friction between the carrier tape 200 and the guide member 20, and thereby speedily remove the top tape 204. Furthermore, since a force biasing the carrier tape 200 toward the guide member 20 is small, the friction between the carrier tape 200 and the guide member 20 hardly increase when the adhesive 206a, swarf of the top tape 204, and like separated from the base tape 202 or the top tape 204 during removing of the top tape 204 intrude between the carrier tape 200 and the tape guide member 20.

In the embodiment, the top tape removing device 50 can remove the top tape 204 from the base tape 202 at a steady removal capacity.

Specifically, in the embodiment, as shown in FIG. 1, within the straight tape path P2 extending in the oblique direction, the portion of the carrier tape 200, from which the top tape 204 is removed by the top tape removing device 50, is between the first and second sprocket wheels 12 and 14 in the tape feeding direction. The two sprocket wheels 12 and 14 rotate in synchronization. Therefore, the blade edge 52a of the removing member 52 of the top tape removing device 50 is thrust between the base tape 202 and the top tape 204 by the first sprocket wheel 12 upstream of the tape feeding direction while the carrier tape 200 (base tape 202) with the top tape 204 removed is pulled toward the downstream side by the second sprocket wheel 14 downstream of the tape feeding direction. Consequently, the top tape removing device 50 can remove the top tape 204 at a steady removal capacity, as compared with the case that one sprocket wheel is disposed either the upstream or downstream of the tape feeding direction.

The distance in the extending direction of the tape path P2 between the first and second sprocket wheels 12 and 14 preferably is as short as possible. Consequently, the top tape removing device 50 can further stably remove the top tape 204.

Additionally, in the embodiment, the second sprocket wheel 14 engages with the feed holes 202b of the carrier tape 200 after removing the top tape 204 at a position downstream of the top tape removing device 50 in the feeding direction of the carrier tape 200 and close to the component supply position Q. Therefore, the second sprocket wheel 14 can function as a guide member locating the carrier tape 200 in the width direction within the tape path P3. Consequently, a locational accuracy of feeding operation for feeding the carrier tape 200 toward the component supply position Q is increased, and thereby can highly locate a component in a recess 202a of the carrier tape 200 at the component supply position Q.

If there is no the second sprocket wheel 14, it is possible to lead to variation in positions of the recesses 202a of the carrier tape 200 after removing the top tape 204 (in particular, positions in the tape width direction of the carrier tape 200), within a region downstream of the top tape removing device 50 in the feeding direction of the carrier tape 200. The reason is that the removing by the removing member 52 of the top tape removing device 50 varies depending on wear of the blade edge 52b, a condition of the adhesive 206 of the carrier tape 200, and like.

For this reason, In the embodiment, the second sprocket wheel 14 for engaging with the feed holes 202b of the carrier tape 200 preferably is disposed at the position downstream of the top tape removing device 50 in the feeding direction of the carrier tape 200 and close to the component supply position Q. Thereby highly locate the component in the recess 202a of the carrier tape 200 at the component supply position Q.

Though the invention has been described with reference to the above embodiment, the invention is not limited to the embodiment.

For example, in the above embodiment, the second sprocket wheel 14, which is disposed downstream of the top tape removing device 50 in the feeding direction of the carrier tape 200, engages with the feed holes 202b of the carrier tape 200 through the teeth 14a thereof at the position upstream of the component supply position Q in the feeding direction. The invention is not limited to this.

Figure 5:
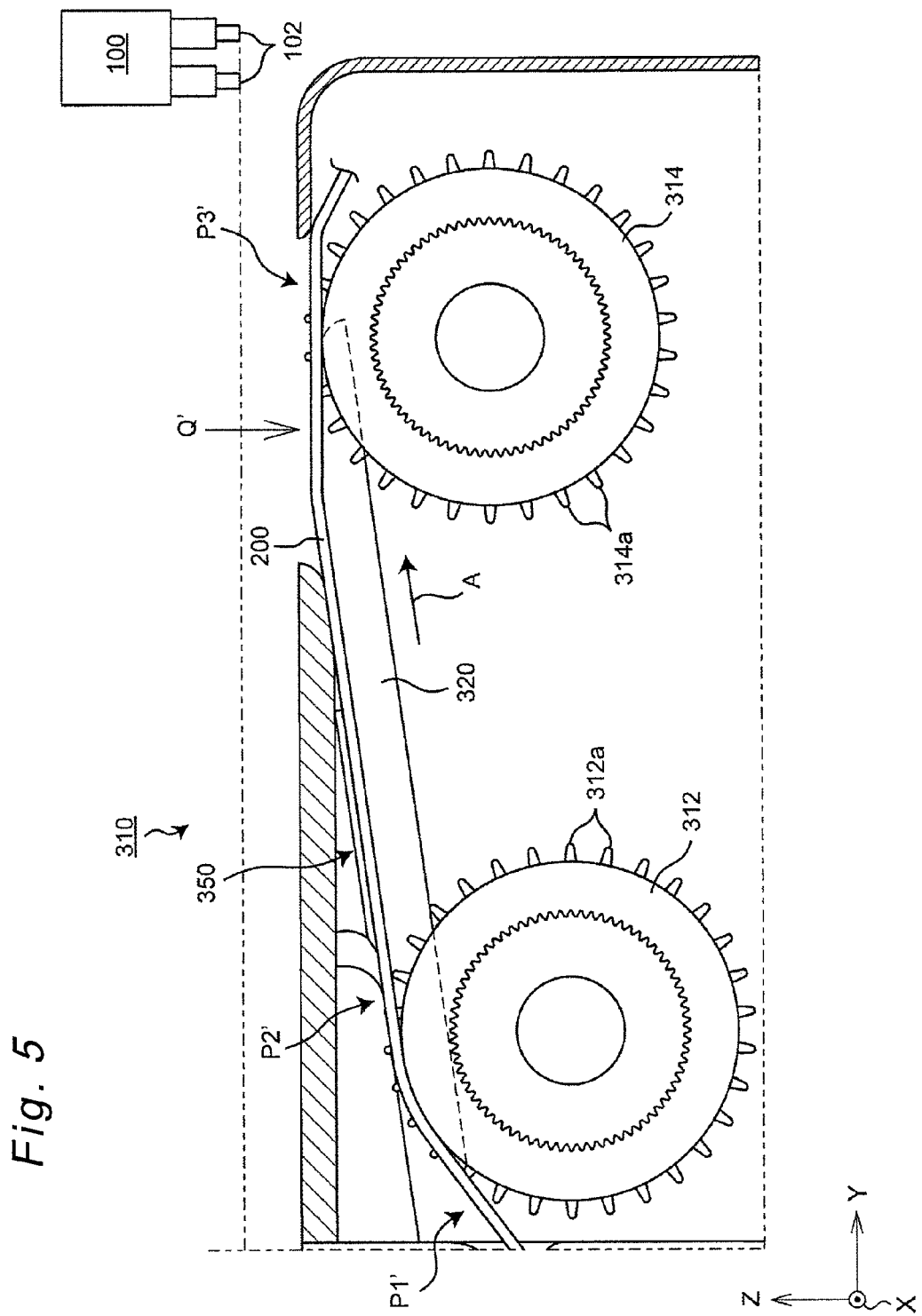
FIG. 5 is a partial enlarged view of a component supplying apparatus according to an another embodiment.

For example, in a component supplying apparatus 310 according to an another embodiment shown in FIG. 5, a second sprocket wheel 314 is disposed downstream of a top tape removing device 350 in a feeding direction of the carrier tape 200 (in a direction of arrow A), and teeth 314a thereof engage with the feed holes 202b of the carrier tape 200 after removing the top tape 204 at a downstream of a component supply position Q' in the feeding direction of the carrier tape 200.

In this case, as shown in FIG. 5, the component supply position Q' is positioned between a first sprocket wheel 312 and the second sprocket wheel 314, and thereby highly locate a portion of carrier tape 200 between two sprocket wheels 312 and 314.

Therefore, the component in the recess 202a of the carrier tape 200 can highly be located at the component supply position Q'.

In the component supplying apparatus 10 of the above embodiment, as shown in FIG. 1, the second sprocket wheel 14 is disposed close to the component supply position Q. The invention is not limited to this. A sprocket wheel (the second sprocket wheel) disposed close to the component supply position Q may be omitted on condition that the omission has no influence on feeding of the carrier tape 200 and removing of the top tape 204.

Figure 6:
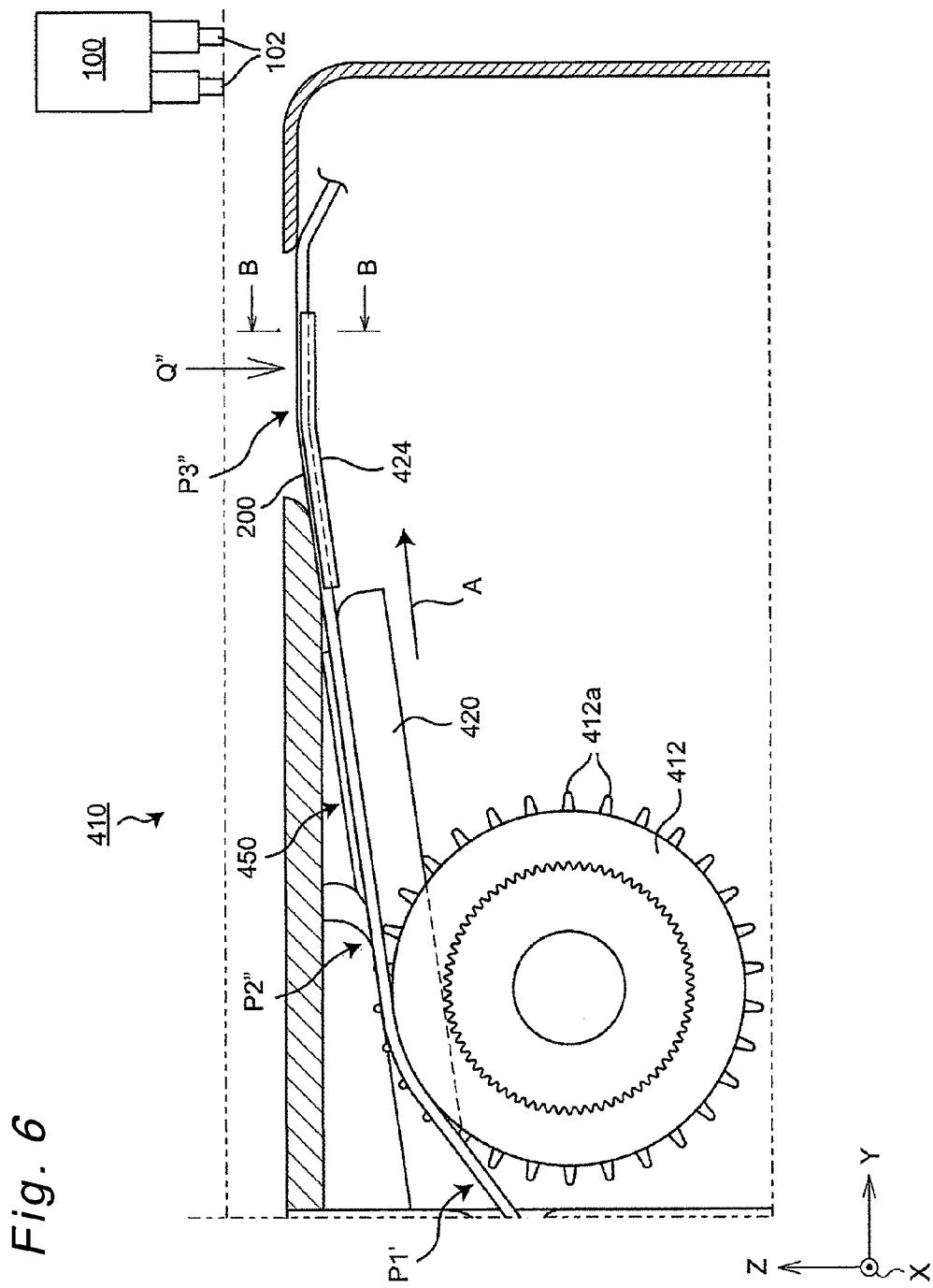
FIG. 6 is a partial enlarged view of a component supplying apparatus according to a yet another embodiment.

FIG. 6 shows a part of a component supplying apparatus 410 according to a yet another embodiment. The component supplying apparatus 410 shown in FIG. 6 has, as well as the component supply apparatus 10 of the above embodiment shown in FIG. 1, a first sprocket wheel 412 engaging with the feed holes 202b of the carrier tape 200 within a tape path P2" which is an inclined straight path extending obliquely upward toward a level of a component supply position Q". The component supplying apparatus 10 also has a top tape removing device 450 similar to the top tape removing device 50 of the component supplying apparatus 10 above the carrier tape 200 on the tape path P2".

However, contrary to the component supplying apparatus 10 shown in FIG. 1, the component supplying apparatus 410 has no sprocket wheel (second sprocket wheel) engaging with the feed holes 202b of the carrier tape 200 within the tape path P3" which is a horizontal straight path extending in the horizontal direction from a front end of the tape path P2" and running through the component supply position Q".

In this case, the carrier tape 200 within the tape path P3" cannot be located in the width direction of the carrier tape 200 since the second sprocket wheel engaging with the feed holes 202b of the carrier tape 200 within the tape path P3" does not exist. For this reason, the component supplying apparatus 410 preferably may have a guide member 424 for locating the carrier tape 200 in the width direction (X-direction) within the tape path P3" which is a horizontal path running through the component supply position Q".

Figure 7:
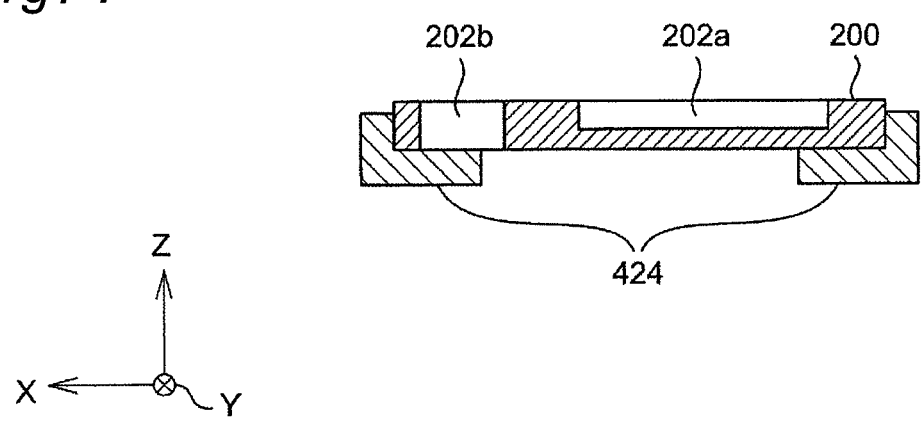
FIG. 7 is a cross-section view along the line B-B in FIG. 6.

The guide member 424, as shown in FIG. 7 representing a cross-section (along line B-B in FIG. 6) perpendicular to the feeding direction (Y-direction) of the carrier tape 200, is configured to support a back surface and both side surfaces in the width direction (X-direction) of the carrier tape 200. In FIG. 7, the top tape with one side portion thereof in the width direction removed is omitted. The guide member 424 can highly locate the component held by the carrier tape 200 at the component supply position Q", instead of the second sprocket wheel as a functional member (guide member) for locating the carrier tape 200 in the width direction within the horizontal path. The guide member 424 may be integrated with a guide member 420 for guiding the back surface of the carrier tape 200 so as to move the carrier tape 200 along the tape path P2" or may be separated from the guide member 420.

Further, in the above embodiment, as shown in FIG. 2, the top tape 204 is partially removed and then folded back toward the feed hole 202-side by the top tape removing device 50 shown in FIG. 3B. The invention does not limit to method for partially removing the top tape 204 from the base tape 202 and the corresponding configuration of the top tape removing device.

Figure 8:
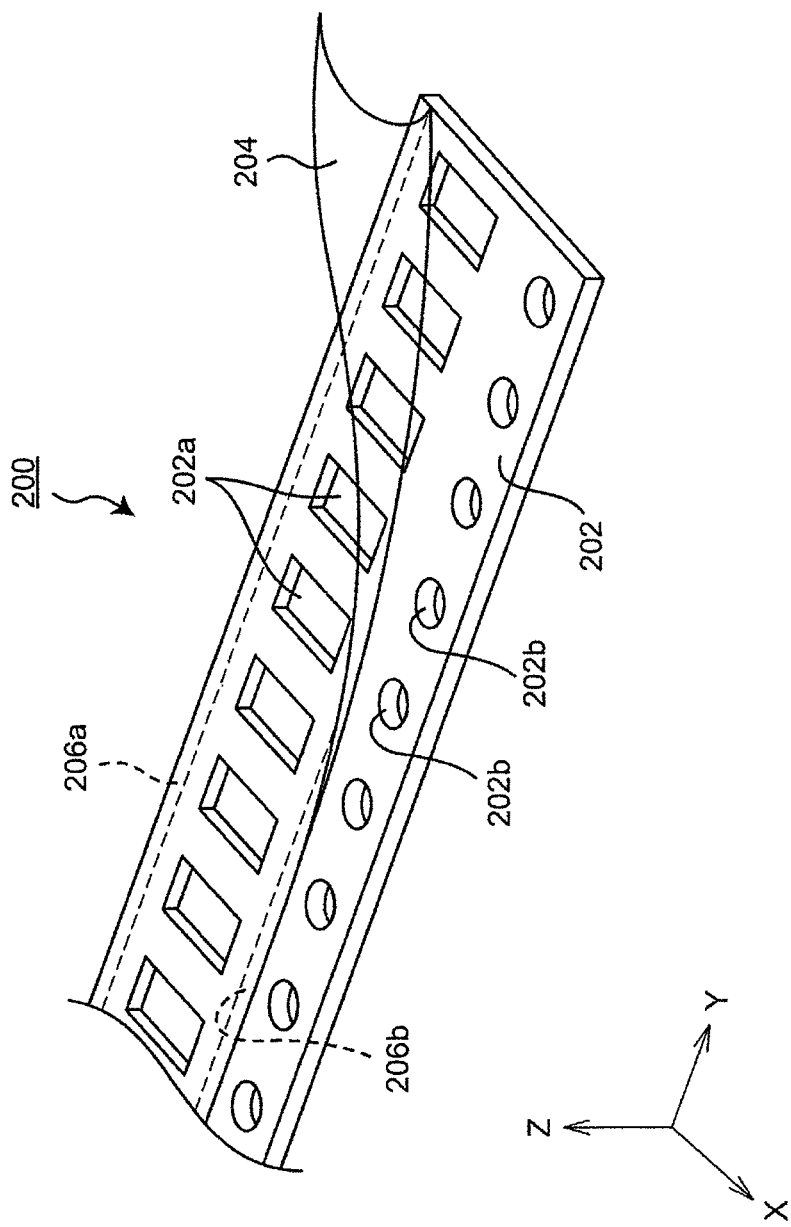
FIG. 8 shows a removal of the top tape by a top tape removing device according to a further embodiment.
Figure 9:
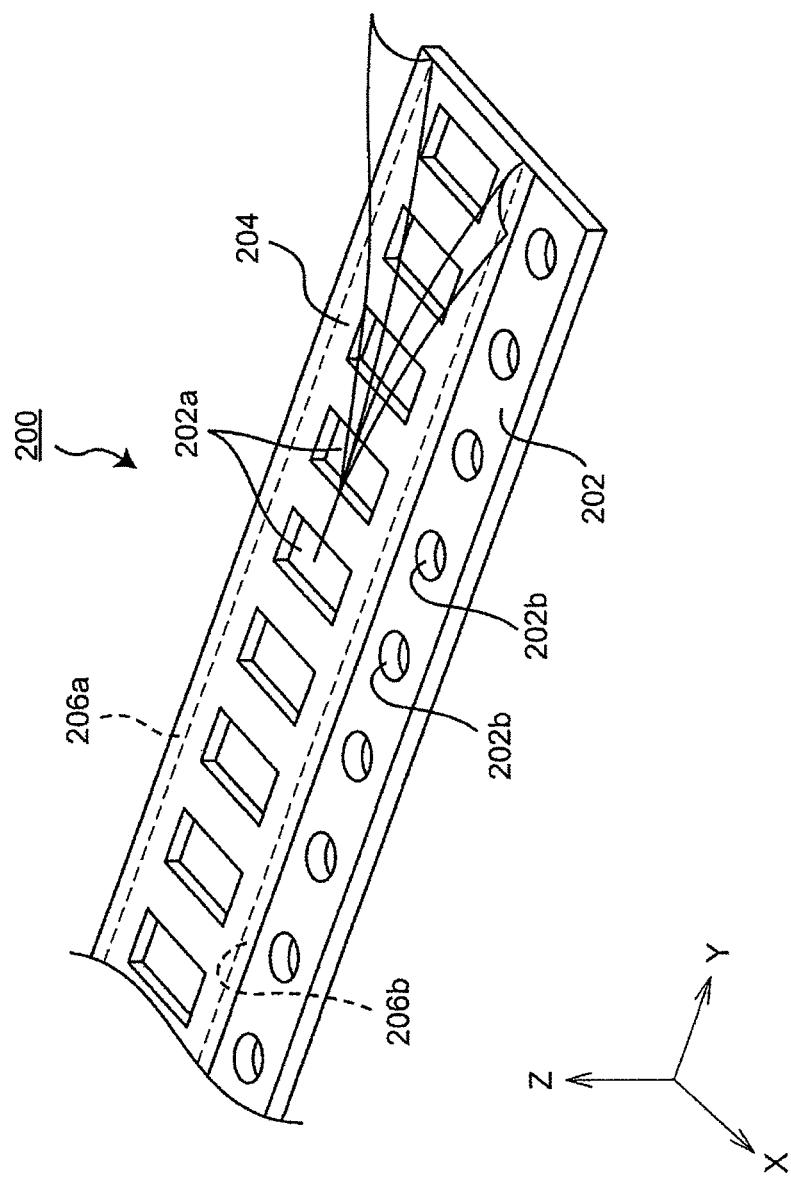
FIG. 9 shows a removal of the top tape by a top tape removing device according to a yet further embodiment.

As shown in FIG. 8, the top tape 204 of the carrier tape 200 may be partially removed so as to fold back toward the side opposite to the feed hole 202b-side in the width direction. That is, the top tape removing device 50 remove the feed hole 202b-side portion in the width direction (X-direction) of the top tape 204 from the base tape 202. Alternatively, as shown in FIG. 9, the top tape 204 may be partially removed from the base tape 202 by firstly cutting a center of width of the top tape 204 in the longitudinal direction (Y-direction) and then folding back each divided portion of the top tape 204 toward the outside in the width direction. In the invention, the top tape 204, in the broad sense, is partially removed from the base tape 202 so as to expose the components in the recesses 202b.

Furthermore, in the above embodiment, as shown in FIGS. 1 and 2, the recesses 202a of the carrier tape 200 are depressions. The invention is not limited to this. In an embodiment of the invention, the carrier tape may have embossed recesses which protrude from the back surface. In this case, the guide member 20 shown in FIG. 1, which supports the back surface of the carrier tape 200 such that the carrier tape 200 can slide in the tape feeding direction and which thus guides the carrier tape 200 such that the carrier tape 200 can moves along the tape path extending in the tape feeding direction, may have a groove extending in the longitudinal direction (feeding direction), through which the embossed parts on the back surface of the carrier tape pass, on a guide surface facing to the back surface of the carrier tape.

Additionally, in the above embodiment shown in FIG. 1, the second sprocket wheel 14 is driven in synchronization with the first sprocket wheel 12. The second sprocket wheel 14 may be configured not to receive a drive power necessary to spontaneously feed the carrier tape 200 in the tape feeding direction on condition that there is no an influence on feeding of the carrier tape 200 thereby. In this case, the second sprocket wheel 14 mainly functions to locate the carrier tape 200 in the width direction within the horizontal path P3.

Although the present invention has been fully described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

The entire disclosure of Japanese Patent Applications No. 2012-167331 filed on Jul. 27, 2012, including specification, claims, and drawings are incorporated herein by reference in its entirety.

INDUSTRIAL APPLICABILITY

The invention have applicability to any component supplying apparatus for feeding a carrier tape.

The invention claimed is:

1. A component supplying apparatus for feeding a carrier tape toward a component supply position, the carrier tape having a base tape including a plurality of recesses for accommodating components and a plurality of feed holes, the plurality of recesses and plurality of feed holes being parallel arranged thereon in a tape longitudinal direction, and a top tape being pasted on the base tape so as to cover the plurality of recesses, the component supply position being a position at which one of the components is sucked by a nozzle of a transfer head of a component mounting apparatus moving in at least a horizontal direction, the component supplying apparatus comprising:
   an inclined path which feeds the carrier tape straight forward and obliquely upward;
   a horizontal path which feeds the carrier tape straight forward and in a horizontal direction from a front end of the inclined path, the horizontal path running through the component supply position;
   a first sprocket wheel having teeth to engage with the plurality of feed holes of the carrier tape within the inclined path;
   a second sprocket wheel having teeth to engage with the plurality of feed holes of the carrier tape within the front end of the inclined path and a rear end of the horizontal path;
   a top tape removing device disposed above a portion of the inclined path between the first sprocket wheel and the second sprocket wheel and having a blade edge to partially remove the top tape from the base tape while on the inclined path so as to expose the components; and
   a sprocket wheel drive device to rotate the first sprocket wheel and the second sprocket wheel.

2. The component supplying apparatus according to claim 1,
   wherein the sprocket wheel drive device includes a motor to synchronously rotate the first sprocket wheel and the second sprocket wheel, wherein teeth of said first sprocket wheel and teeth of said second sprocket wheel engage with the feed holes of the carrier tape so as to feed the carrier tape toward the component supply position, the component supply position being located on the horizontal path after a position of maximum engagement of the second sprocket wheel in the feed holes of the carrier tape.

3. The component supplying apparatus according to claim 1,
wherein the top tape removing device is configured to be disposed below a lower limit level of nozzle of the transfer head when moving.

4. The component supplying apparatus according to claim 1,
wherein the top tape removing device is disposed in a space between the inclined path and a top cover which is positioned within an operation range in the horizontal direction of the transfer head and which is a top portion of a housing of the component supplying apparatus.

5. The component supplying apparatus according to claim 1,
wherein the component supply position is positioned on the horizontal path such that the nozzle of the transfer head sucks a corresponding component accommodated in a corresponding one of the plurality of recesses at the component supply position, the component supply position being located on the horizontal path after a position of maximum engagement of the second sprocket wheel in the feed holes of the carrier tape.

6. A component supplying method for feeding a carrier tape toward a component supply position, the carrier tape having a base tape including a plurality of recesses for accommodating components and a plurality of feed holes, the plurality of recesses and plurality of feed holes being parallel arranged thereon in a tape longitudinal direction, and a top tape being pasted on the base tape so as to cover the plurality of recesses, the component supply position being a position at which one of the components is sucked by a nozzle of a transfer head of a component mounting apparatus moving in at least a horizontal direction, the component supplying method comprising:

feeding the carrier tape along an inclined path and then along a horizontal path by rotations of a first sprocket wheel and a second sprocket wheel, respectively, the inclined path extending straight forward and obliquely upward, the horizontal path extending straight forward and in a horizontal direction from a front end of the inclined path and running through the component supply position, the first sprocket wheel including teeth to engage with feed holes of the carrier tape within the inclined path, and the second sprocket wheel including teeth to engage with feed holes of the carrier tape within the front end of the inclined path and within a rear end of the horizontal path, and partially removing the top tape from the base tape while on the inclined path so as to expose the components by using a blade edge of a top tape removing device disposed above a portion of the inclined path between the first sprocket wheel and the second sprocket wheel.

7. The component supplying apparatus according to claim 1,
wherein the top tape removing device is configured to be disposed below a level of the component supply position.

8. The component supplying apparatus according to claim 1,
wherein the top tape removing device is disposed in a space between the inclined path and a top cover which is positioned within an operation range in the horizontal direction of the nozzle of the transfer head and which is a top portion of a housing of the component supplying apparatus.

* * * * *

UNITED STATES PATENT AND TRADEMARK OFFICE
CERTIFICATE OF CORRECTION

PATENT NO. : 9,578,793 B2
APPLICATION NO. : 14/417401
DATED : February 21, 2017
INVENTOR(S) : Kitani et al.

Page 1 of 1

It is certified that error appears in the above-identified patent and that said Letters Patent is hereby corrected as shown below:

On the Title Page (Page 2) in Item (56), under the "OTHER PUBLICATIONS" heading, please insert the following document:

--Chinese Office Action (OA) and Search Report (SR) issued August 31, 2016 in Chinese Patent Application No. 201380039277.9, together with English translations thereof.--

Signed and Sealed this
Twenty-ninth Day of August, 2017

Joseph Matal
*Performing the Functions and Duties of the*
*Under Secretary of Commerce for Intellectual Property and*
*Director of the United States Patent and Trademark Office*